(12) United States Patent
Clark et al.

(10) Patent No.: US 8,049,100 B2
(45) Date of Patent: *Nov. 1, 2011

(54) MULTIJUNCTION RARE EARTH SOLAR CELL

(75) Inventors: Andrew Clark, Palo Alto, CA (US);
Robin Smith, Palo Alto, CA (US);
Richard Sewell, Palo Alto, CA (US);
Scott Semans, Palo Alto, CA (US); F. Erdem Arkun, Palo Alto, CA (US);
Michael Lebby, Palo Alto, CA (US)

(73) Assignee: Translucent, Inc., Palo Alto, CA (US)

( * ) Notice: Subject to any disclaimer, the term of this patent is extended or adjusted under 35 U.S.C. 154(b) by 2 days.

This patent is subject to a terminal disclaimer.

(21) Appl. No.: 12/619,621

(22) Filed: Nov. 16, 2009

(65) Prior Publication Data

US 2010/0109047 A1 May 6, 2010

Related U.S. Application Data

(63) Continuation-in-part of application No. 12/510,977, filed on Jul. 28, 2009, and a continuation-in-part of application No. 12/408,297, filed on Mar. 20, 2009, and a continuation-in-part of application No. 11/828,964, filed on Jul. 26, 2007.

(51) Int. Cl.
*H01L 31/055* (2006.01)
*H01L 31/028* (2006.01)
(52) U.S. Cl. ........................................ 136/257; 136/261
(58) Field of Classification Search .................. 136/261, 136/257
See application file for complete search history.

(56) References Cited

U.S. PATENT DOCUMENTS

| | | | |
|---|---|---|---|
| 4,842,960 A | 6/1989 | Lindmayer |
| 4,891,507 A | 1/1990 | Lindmayer |
| 5,012,098 A | 4/1991 | Lindmayer |
| 6,541,788 B2 | 4/2003 | Petroff |
| 6,734,453 B2 | 5/2004 | Atanackovic |
| 6,852,575 B2 | 2/2005 | Bojarczuk |
| 6,858,864 B2 | 2/2005 | Atanackovic |
| 6,943,385 B2 | 9/2005 | Usuda |
| 7,018,484 B1 | 3/2006 | Atanackovic |
| 7,023,011 B2 | 4/2006 | Atanackovic |
| 7,008,559 B2 | 5/2006 | Chen |
| 7,037,806 B1 | 5/2006 | Atanackovic |
| 7,129,551 B2 | 10/2006 | Osten |
| 7,135,699 B1 | 11/2006 | Atanackovic |
| 7,199,015 B2 | 4/2007 | Atanackovic |
| 7,199,451 B2 | 4/2007 | Kelman |

(Continued)

OTHER PUBLICATIONS

Curtin, B.M.;"Photonic crystal back-reflectors for light management and enhanced absorption in a-Si:H solar cells"; M.Sc. Thesis, 2009; Iowa State University.

(Continued)

*Primary Examiner* — Jennifer K. Michener
*Assistant Examiner* — Dustin Q Dam
(74) *Attorney, Agent, or Firm* — Fernandez & Associates, LLP

(57) ABSTRACT

Examples of device structures utilizing layers of rare earth oxides to perform the tasks of strain engineering in transitioning between semiconductor layers of different composition and/or lattice orientation and size are given. A structure comprising a plurality of semiconductor layers separated by transition layer(s) comprising two or more rare earth compounds operable as a sink for structural defects is disclosed.

11 Claims, 16 Drawing Sheets

REO based epitaxial engineered substrate

U.S. PATENT DOCUMENTS

Figure 1A:
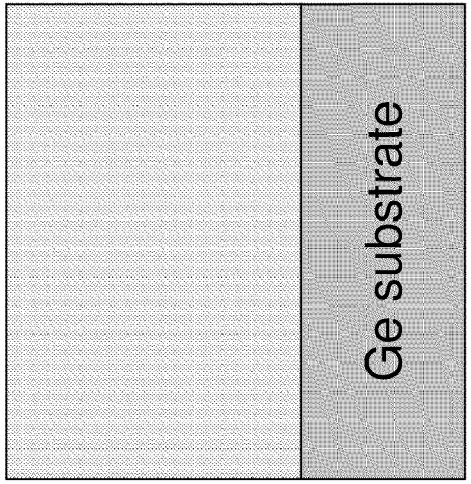

| | | | |
|---|---|---|---|
| 7,211,821 | B2 | 5/2007 | Atanackovic |
| 7,217,636 | B1 | 5/2007 | Atanackovic |
| 7,253,080 | B1 | 8/2007 | Atanackovic |
| 7,273,657 | B2 | 9/2007 | Atanackovic |
| 7,351,993 | B2 | 4/2008 | Atanackovic |
| 7,384,481 | B2 | 6/2008 | Atanackovic |
| 7,416,959 | B2 | 8/2008 | Atanakovic |
| 7,432,550 | B2 | 10/2008 | Bojarczuk |
| 7,501,627 | B1 | 3/2009 | Herr |
| 2005/0145972 | A1* | 7/2005 | Fukuda et al. ............... 257/458 |
| 2005/0161773 | A1 | 7/2005 | Atanackovic |
| 2005/0163692 | A1 | 7/2005 | Atanackovic |
| 2006/0060826 | A1 | 3/2006 | Atanackovic |
| 2006/0145186 | A1* | 7/2006 | Wallis ........................ 257/190 |
| 2008/0241519 | A1 | 10/2008 | Shroeder |
| 2009/0183774 | A1 | 7/2009 | Atanackovic |
| 2009/0235974 | A1* | 9/2009 | Mapel et al. ................ 136/246 |

OTHER PUBLICATIONS

Hetzer, M.J.; "Chemical and electronic characterization of copper indium gallium diselenide thin film solar cells and correlation of these characterisitics to solar cell operation"; Ph.D. thesis, 2009; Ohio State University.

Zhou, D.; "Light-trapping enhancement in thin film solar cells"; M.Sc. thesis, 2008; Iowa State University.

Mutitu, J.G., et al.; "Thin film silicon solar cell design based on photonic crystal and diffractive grating structures"; Optics Express; 16, #19, Sep. 15, 2008; 15238.

Dewan, R., et al; "Light trapping in thin-film silicon solar cells with integrated diffraction grating"; Jl. Appl. Physics, 106, 074901, 2009.

Bermal, P., et al.; "Improving Thin-Film Crystalline Silicon Solar Cell Efficiencies With Photonic Crystals"; Optics Express; 15, #15, Dec. 10, 2007; 16986.

Richards, B., et al.; "Enhancing the near-infrared spectral response of silicon optoelectronic devices via up-conversion"; IEEE Transactions on Electron Devices, 54, #10, Oct. 2007.

Sewell, R.H., et al.; "Epitaxial rare-earth oxide layers for enhancement of silicon based solar cells"; 24th European Photovoltaic Solar Energy Conference 2009.

* cited by examiner

III-V Triple junction cell (prior art)

Ge on insulator, bonded to Si wafer (prior art)

| x(SiGe) | a(SiGe) | %mismatch |
|---|---|---|
| 0 | 5.431 | 0.0% |
| 0.1 | 5.451 | 0.4% |
| 0.2 | 5.472 | 0.8% |
| 0.3 | 5.493 | 1.2% |
| 0.4 | 5.515 | 1.6% |
| 0.5 | 5.538 | 2.0% |
| 0.6 | 5.561 | 2.4% |
| 0.7 | 5.584 | 2.8% |
| 0.8 | 5.608 | 3.3% |
| 0.9 | 5.633 | 3.7% |
| 1 | 5.658 | 4.2% |

$Si_{1-x}Ge_x$

Figure 3

| La | Ge | Pr | Nd | Pm | Sm | Si | Gd | Tb | Dy | Ho | Er | Tm | Yb |
|----|----|----|----|----|----|----|----|----|----|----|----|----|----|
| 11.36 | 11.32 | 11.15 | 11.08 | 10.99 | 10.93 | 10.86 | 10.81 | 10.73 | 10.67 | 10.61 | 10.55 | 10.49 | 10.44 |

Lattice spacing = a

Comparison of $a_{RE}$ vs $2a_{Si}$, $2a_{Ge}$

Figure 5

| x(Si$_{1-x}$Ge$_x$) | a(SiGe) | y(Gd$_{1-y}$Nd$_y$O) | y(Gd$_{1-y}$Pr$_y$O) | y(Er$_{1-y}$La$_y$O) |
|---|---|---|---|---|
| 0 | 5.431 | 0.82 | 0.86 | 0.62 |
| 0.1 | 5.451 | 0.67 | 0.74 | 0.57 |
| 0.2 | 5.472 | 0.51 | 0.62 | 0.52 |
| 0.3 | 5.493 | 0.35 | 0.49 | 0.47 |
| 0.4 | 5.515 | 0.18 | 0.36 | 0.41 |
| 0.5 | 5.538 | 0.01 | 0.23 | 0.36 |
| 0.6 | 5.561 | | 0.10 | 0.30 |
| 0.7 | 5.584 | | | 0.24 |
| 0.8 | 5.608 | | | 0.18 |
| 0.9 | 5.633 | | | 0.12 |
| 1 | 5.658 | | | 0.06 |

Examples of various complex ternary REO that can be used to transition between Si$_{1-x}$Ge$_x$ alloys.

$2a_{Si_xGe_{1-x}} - a_{RE1_{x2}RE2_{1-x2}} = 0$ $(RE1_xRE2_{1-x})_2O_3$ $2a_{Si} - a_{RE1_{x1}RE2_{1-x1}} = 0$

Lattice matched at both lower and upper interface $Si_xGe_{1-x}$ silicon

REO $2a_{Si_xGe_{1-x}} - a_{RE1_{x2}RE2_{1-x2}} > 0$ $(RE1_xRE2_{1-x})_2O_3$ $2a_{Si} - a_{RE1_{x1}RE2_{1-x1}} < 0$

Si$_x$Ge$_{1-x}$

REO silicon

Strain balanced:
lower interface under biaxial compressive stress, < 0.
upper interface under biaxial tensile strain, > 0.

RE1=Er; RE2=La;

x1=0.46;
x2=0.24;

$Si_{0.3}Ge_{0.7} \dashrightarrow Si_{0.7}Ge_{0.3}$

RE1=Gd; RE2=Nd;

x1=0.82;
x2=0.35;

$Si \dashrightarrow Si_{0.3}Ge_{0.7}$

Figure 9
Combining unit cells to span lattice mismatch between silicon and germanium.
$(RE5_z RE6_{1-z})_2 O_3$
$(RE3_y RE4_{1-y})_2 O_3$
$(RE1_x RE2_{1-x})_2 O_3$
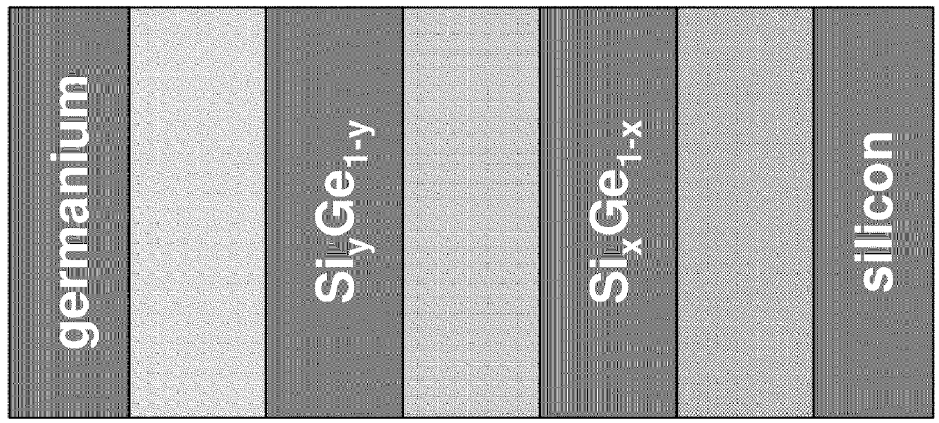
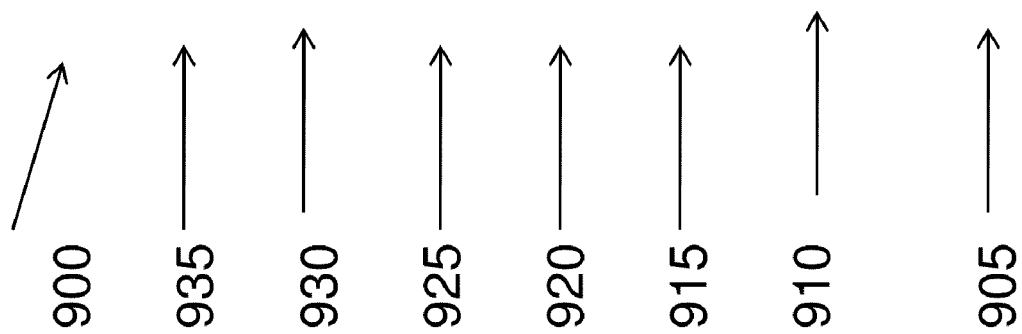

$[Si/Si_{1-z}Ge_z/Si_{1-x-y}Ge_xEr_y/Si_{1-z}Ge_z]SL\ //Si(001)$

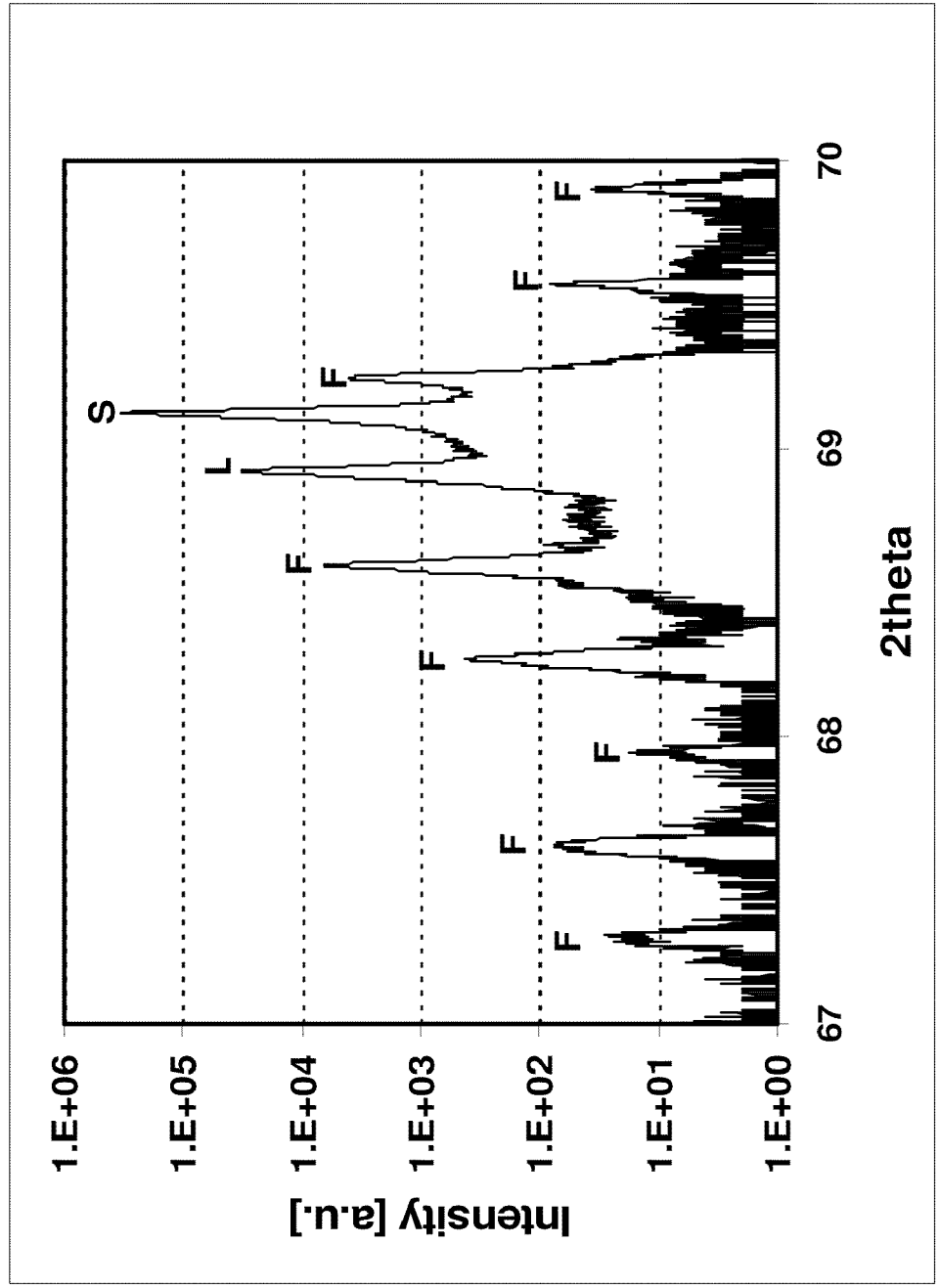
Figure 13 – DCXRD of the structure of Fig12.
(S = substrate, L=layer F= fringe)

US 8,049,100 B2

MULTIJUNCTION RARE EARTH SOLAR CELL

PRIORITY

This application is a continuation-in-part of application Ser. No. 11/828,964, filed on Jul. 26, 2007, Ser. No. 12/408, 297, filed on Mar. 20, 2009 and Ser. No. 12/510,977, filed on Jul. 28, 2009 and claims priority from these applications, all three included herein in their entirety by reference.

CROSS REFERENCE TO RELATED APPLICATIONS

Applications and patent Ser. Nos. 11/025,692, 11/025,693, U.S. 20050166834, Ser. Nos. 11/253,525, 11/257,517, 11/257,597, 11/393,629, 11/472,087, 11/559,690, 11/599, 691, 11/788,153, 11/828,964, 11/858,838, 11/873,387, 11/960,418, 11/961,938, 12/119,387, 60/820,438, 61/089, 786, Ser. Nos. 12/029,443, 12/046,139, 12/111,568, 12/119, 387, 12/171,200, 12/408,297, 12/510,977, 60/847,767, U.S. Pat. No. 6,734,453, U.S. Pat. No. 6,858,864, U.S. Pat. No. 7,018,484, U.S. Pat. No. 7,023,011 U.S. Pat. No. 7,037,806, U.S. Pat. No. 7,135,699, U.S. Pat. No. 7,199,015, U.S. Pat. No. 7,211,821, U.S. Pat. No. 7,217,636, U.S. Pat. No. 7,273, 657, U.S. Pat. No. 7,253,080, U.S. Pat. No. 7,323,737, U.S. Pat. No. 7,351,993, U.S. Pat. No. 7,355,269, U.S. Pat. No. 7,364,974, U.S. Pat. No. 7,384,481, U.S. Pat. No. 7,416,959, U.S. Pat. No. 7,432,569, U.S. Pat. No. 7,476,600, U.S. Pat. No. 7,498,229, U.S. Pat. No. 7,586,177, U.S. Pat. No. 7,599, 623 and U.S. Applications titled "Photovoltaic conversion using rare earths plus Group IV sensitizers", [P047]; "Photovoltaic conversion using rare earths plus transition metal sensitizers", [P048]; "Rare earth structures with semiconductor layers", [P046]; "Passive rare earth tandem solar cell", [P050]; and "Active rare earth tandem solar cell", [P051], all held by the same assignee, contain information relevant to the instant invention and are included herein in their entirety by reference. References, noted in the specification and Information Disclosure Statement, are included herein in their entirety by reference.

BACKGROUND OF THE INVENTION

1. Field of the Invention

The invention relates generally to a semiconductor based structure for transitioning from one semiconductor material composition to another by the use of one or more transition layers comprising more than one rare earth.

2. Description of Related Art Including Information Disclosed Under 37 CFR 1.97 and 1.98

One approach to improve efficiency in a solar cell is multiple junctions where specific materials are matched to discrete portions of the solar spectrum. For example it is widely accepted that a single junction, single crystal silicon solar cell has an optimum performance in the wavelength range 500 to 1,100 nm, whilst the solar spectrum extends from 400 nm to in excess of 2,500 nm.

As used herein a rare earth, [$RE_1, RE_2, \ldots RE_n$], is chosen from the lanthanide series of rare earths from the periodic table of elements {$^{57}$La, $^{58}$Ce, $^{59}$Pr, $^{60}$Nd, $^{61}$Pm, $^{62}$Sm, $^{63}$Eu, $^{64}$Gd, $^{65}$Tb, $^{66}$Dy, $^{67}$Ho, $^{68}$Er, $^{69}$Tm, $^{70}$Yb and $^{71}$Lu} plus yttrium, $^{39}$Y, and scandium, $^{21}$Sc, are included as well for the invention disclosed.

As used herein a transition metal, [$TM_1, TM_2 \ldots TM_n$], is chosen from the transition metal elements consisting of {$^{22}$Ti, $^{23}$V, $^{24}$Cr, $^{25}$Mn, $^{26}$Fe, $^{27}$Co, $^{28}$Ni, $^{29}$Cu, $^{30}$Zn, $^{40}$Zr, $^{41}$Nb, $^{42}$Mo, $^{43}$Tc, $^{44}$Ru, $^{45}$Rh, $^{46}$Pd, $^{47}$Ag, $^{48}$Cd, $^{71}$Lu, $^{72}$Hf, $^{73}$Ta, $^{74}$W, $^{75}$Re, $^{76}$Os, $^{77}$Ir, $^{78}$Pt, $^{77}$Au, $^{80}$Hg}. Silicon and germanium refer to elemental silicon and germanium; Group IV, Groups III and V and Groups II and VI elements have the conventional meaning. As used herein all materials and/or layers may be present in a single crystalline, polycrystalline, nanocrystalline, nanodot or quantum dot and amorphous form and/or mixture thereof.

In addition certain of these rare earths, sometimes in combination with one or more rare earths, and one or more transition metals can absorb light at one wavelength (energy) and re-emit at another wavelength (energy). This is the essence of wavelength conversion; when the incident, adsorbed, radiation energy per photon is less than the emission, emitted, energy per photon the process is referred to as "up conversion". "Down conversion" is the process in which the incident energy per photon is higher than the emission energy per photon. An example of up conversion is Er absorbing at 1,480 nm and exhibiting photoluminescence at 980 nm.

U.S. Pat. No. 6,613,974 discloses a tandem Si—Ge solar cell with improved efficiency; the disclosed structure is a silicon substrate onto which a Si—Ge epitaxial layer is deposited and then a silicon cap layer is grown over the Si—Ge layer; no mention of rare earths is made. U.S. Pat. No. 7,364,989 discloses a silicon substrate, forming a silicon alloy layer of either Si—Ge or Si—C and the depositing a single crystal rare earth oxide, binary or ternary; the alloy content of the alloy layer is adjusted to select a type of strain desired; the preferred type of strain is "relaxed"; the preferred deposition method for the rare earth oxide is atomic layer deposition at temperatures below 300° C. While the Si—Ge film is "relaxed", its primary function is to impart no strain, tensile strain or compressive strain to the rare earth oxide layer; the goal being to improve colossal magnetoresistive, CMR, properties of the rare earth oxide. A preferred method disclosed requires a manganese film be deposited on a silicon alloy first. Recent work on rare earth films deposited by an ALD process indicate the films are typically polycrystalline or amorphous.

BRIEF SUMMARY OF THE INVENTION

Examples of device structures utilizing layers of rare earth oxides to perform the tasks of strain engineering in transitioning between semiconductor layers of different composition and/or lattice orientation or size. A structure comprising a plurality of semiconductor layers separated by two or more rare earth based transition layers operable as a sink for structural defects is disclosed. One advantage of thin films is the control provided over a process both in tuning a material to a particular wavelength and in reproducing the process in a manufacturing environment. In some embodiments, rare earth oxides, nitrides, and phosphides, transition metals and silicon/germanium materials and various combinations thereof may be employed. As used herein the terms, "oxides" and "rare-earth oxide[s]" are inclusive of rare earth oxides, nitrides, and phosphides and combinations thereof.

BRIEF DESCRIPTION OF THE SEVERAL VIEWS OF THE DRAWING(S)

Figure 1B:
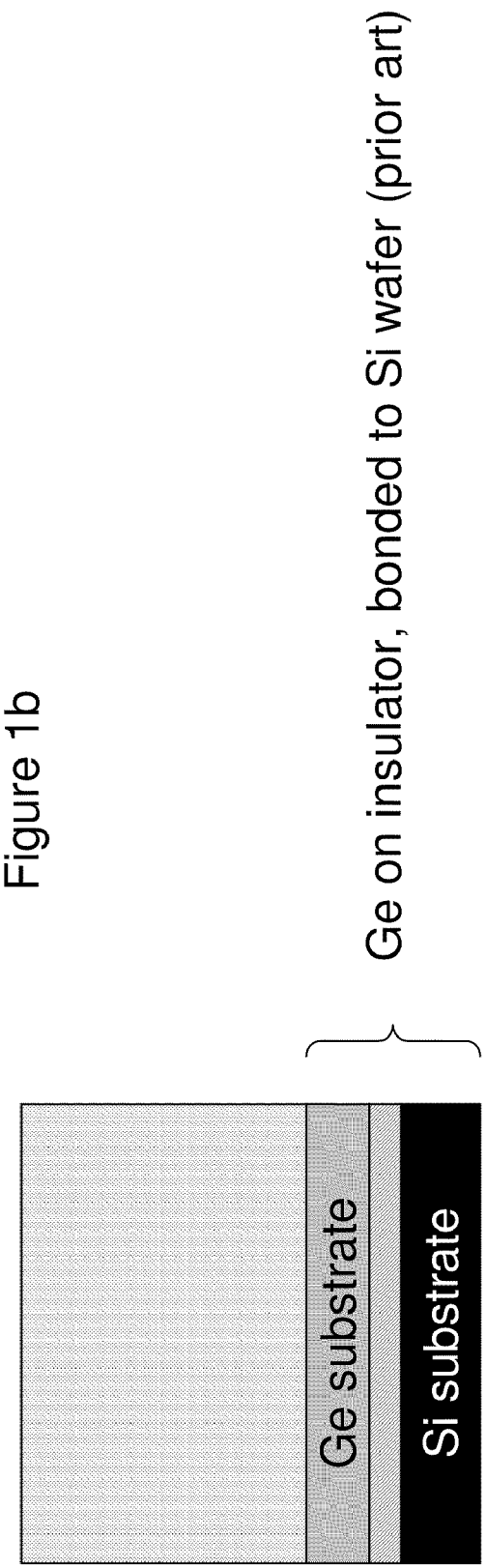

FIG. 1a: Prior art for triple junction cell on Ge substrate; FIG. 1b triple junction cell on Ge bonded to Si wafer.

Figures 2A, 2B:
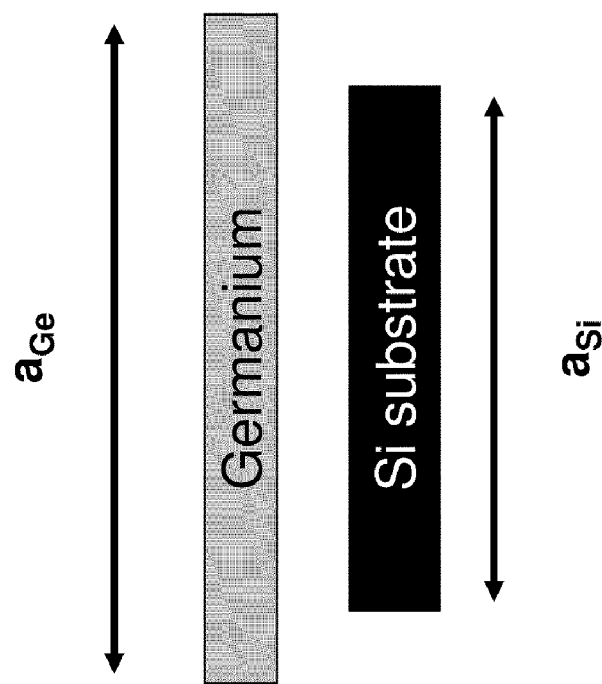
Figure 2C:
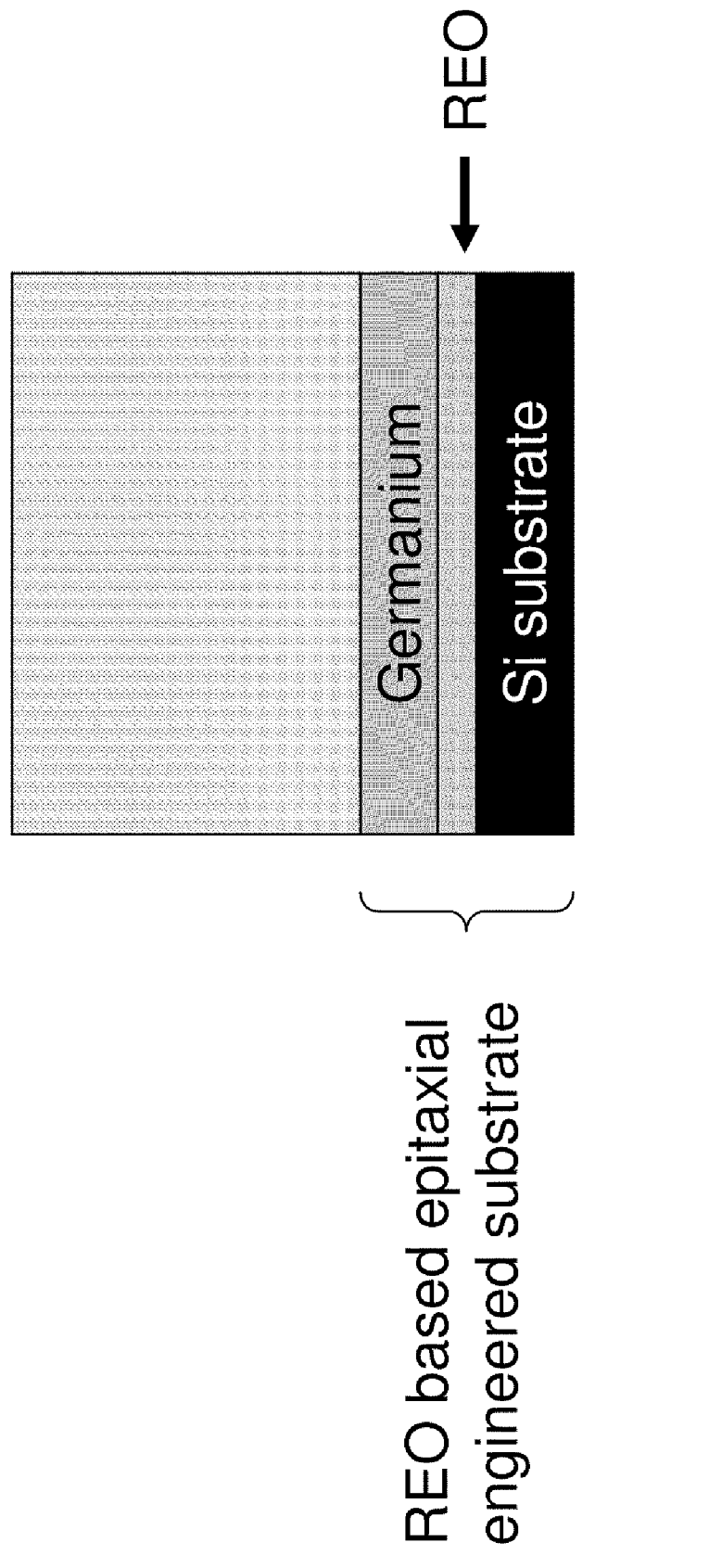

FIG. 2a shows unit cell size versus Ge content in SiGe alloy, FIG. 2b: schematic definition of mismatch between Ge and Si layers; FIG. 2c shows exemplary REO transition layer facilitating Si to Ge layers.

Figures 6A, 6B:
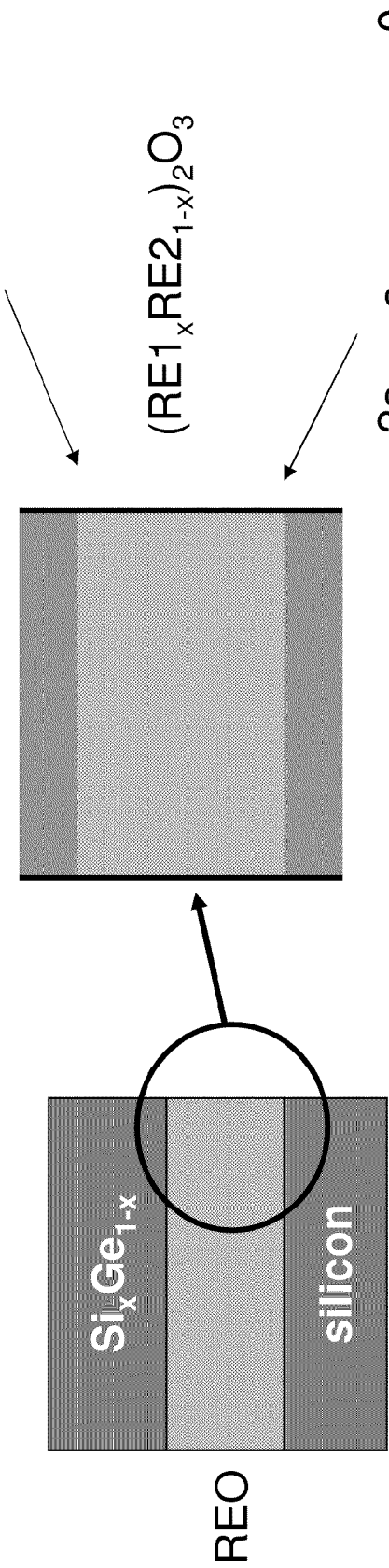

FIG. 3: Relationship between rare earth lattice spacing and lattice spacing of Ge and Si FIG. 4: Examples of ternary RE alloys, relationship of lattice spacing to alloy composition FIG. 5: Calculations of specific RE alloys relative to lattice spacing of various SiGe alloys FIG. 6a: unit cells lattice matched at each interface; FIG. 6b shows calculation of internal layer stress.

Figure 7B:
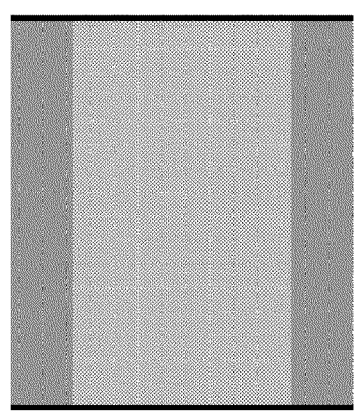
Figure 7A:
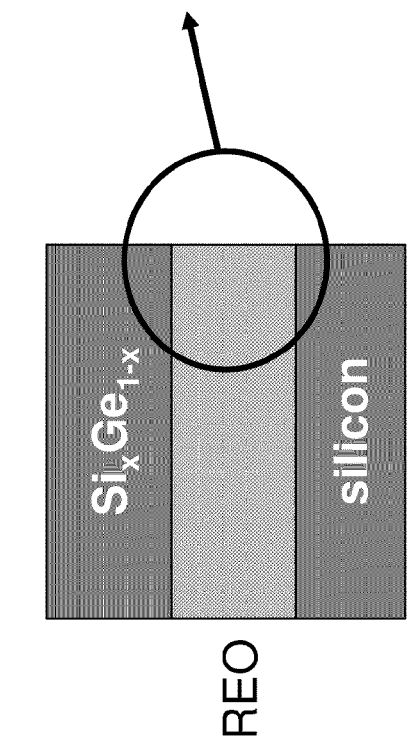

FIG. 7a: Exemplary unit cell with lattice mismatched interfaces; FIG. 7b shows calculation of internal layer stress versus RE composition.

Figure 8B:
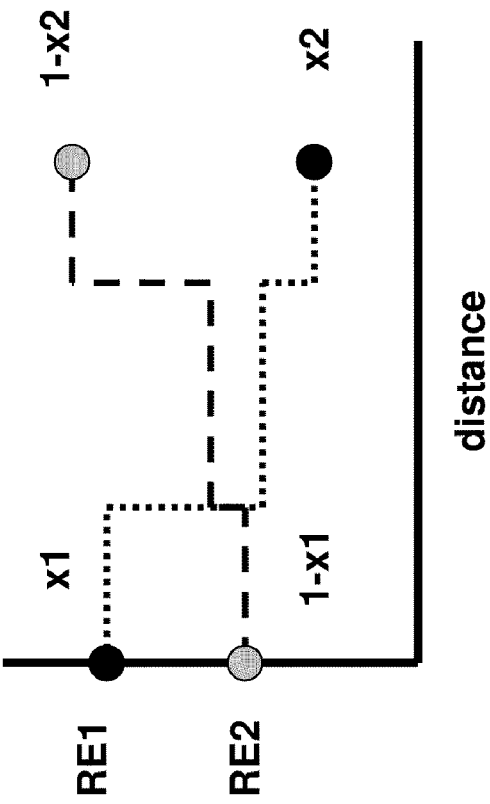
Figure 8A:
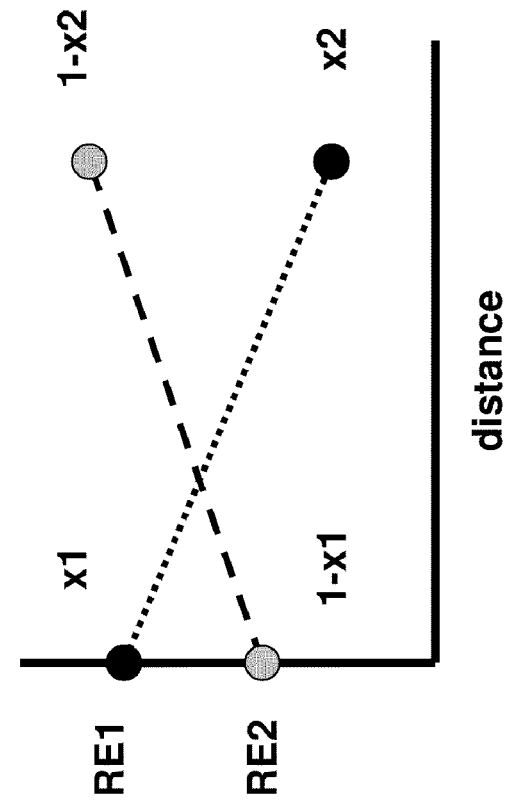

FIGS. 8a and 8b: Examples of RE grading used in REO layer.

FIG. 9: Example of multiple cells in a Ge—Si-REO engineered structure.

Figure 10A:
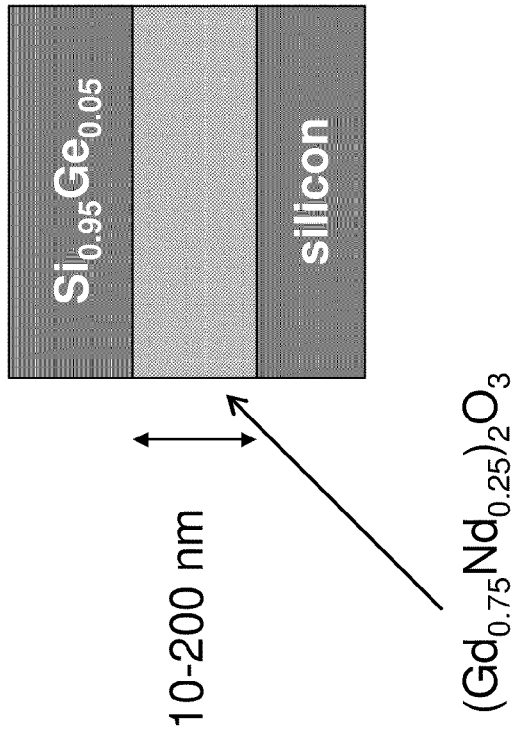

FIG. 10a: Specific embodiment of a unit cell, FIG. 10b accompanying x-ray measurement.

Figure 11:
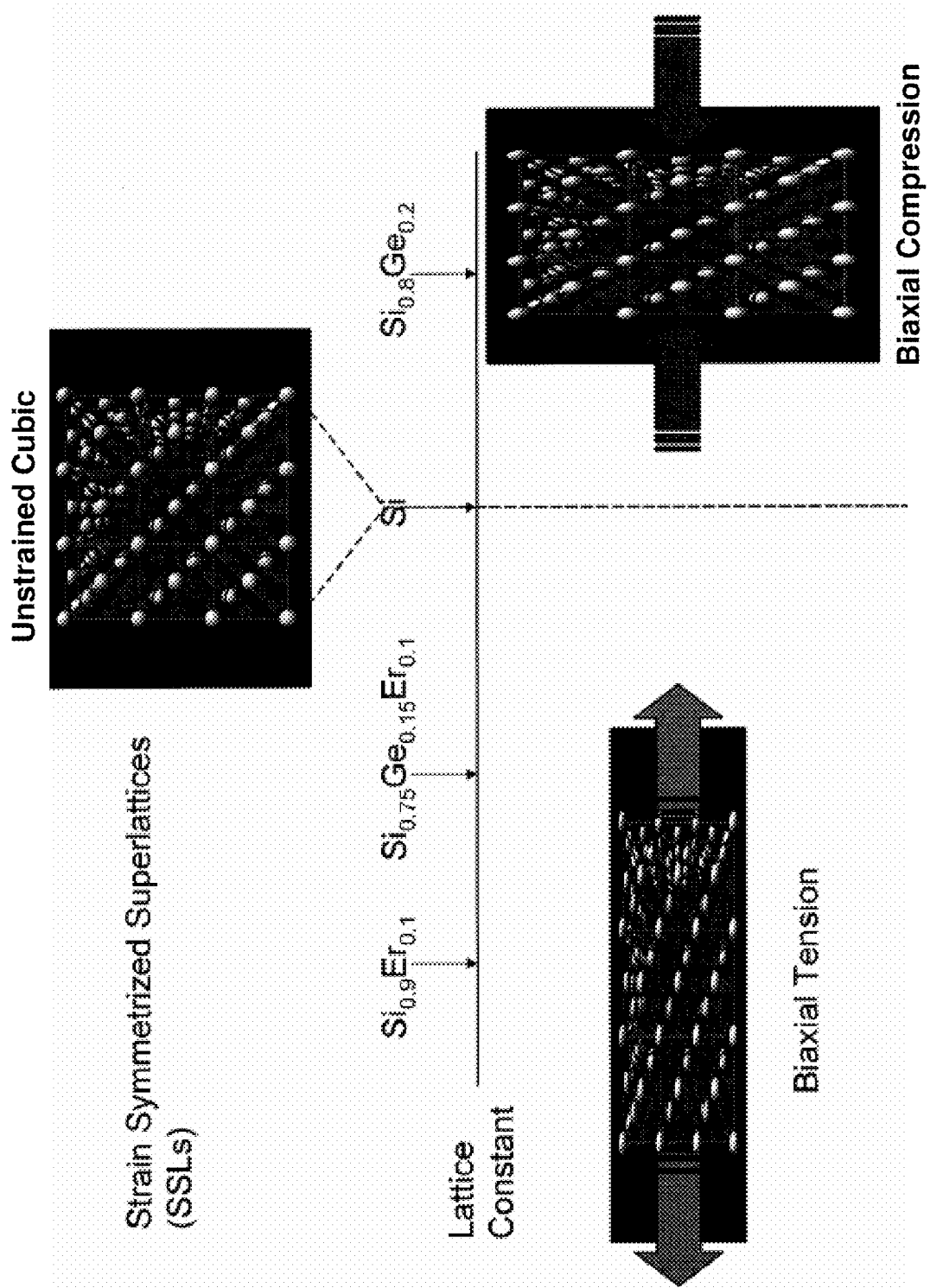

FIG. 11: Example of strain symmetrized superlattice (SSSL) using group IV-RE alloys.

Figure 12B:
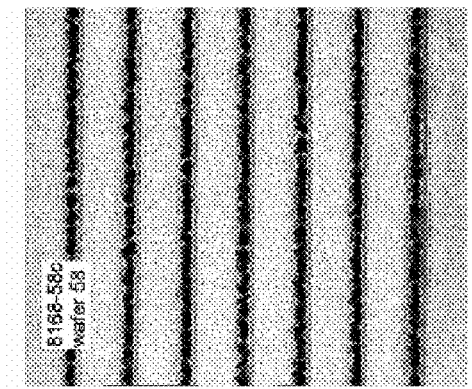
Figure 12A:
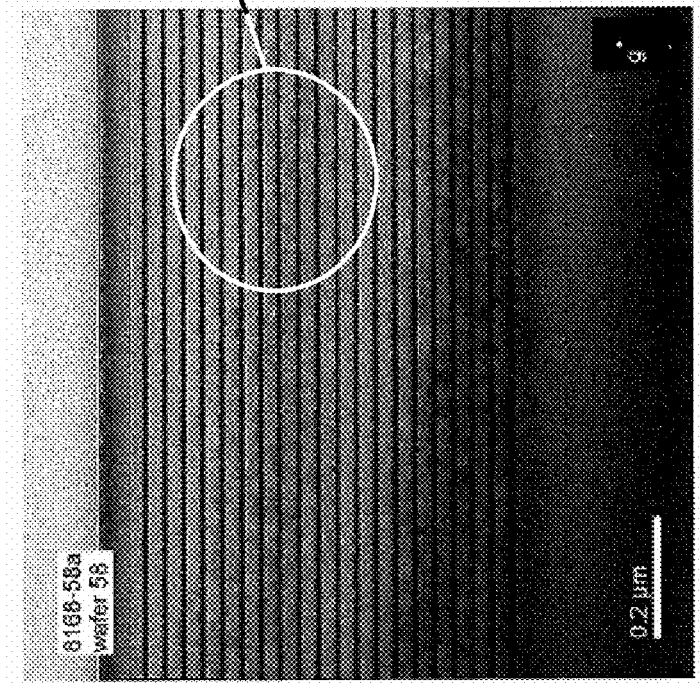

FIG. 12a: Specific embodiment of strain symmetrized superlattice (SSSL);

FIG. 12b magnified superlattice structure.

FIG. 13: X-ray result for SSSL

Figure 14A:
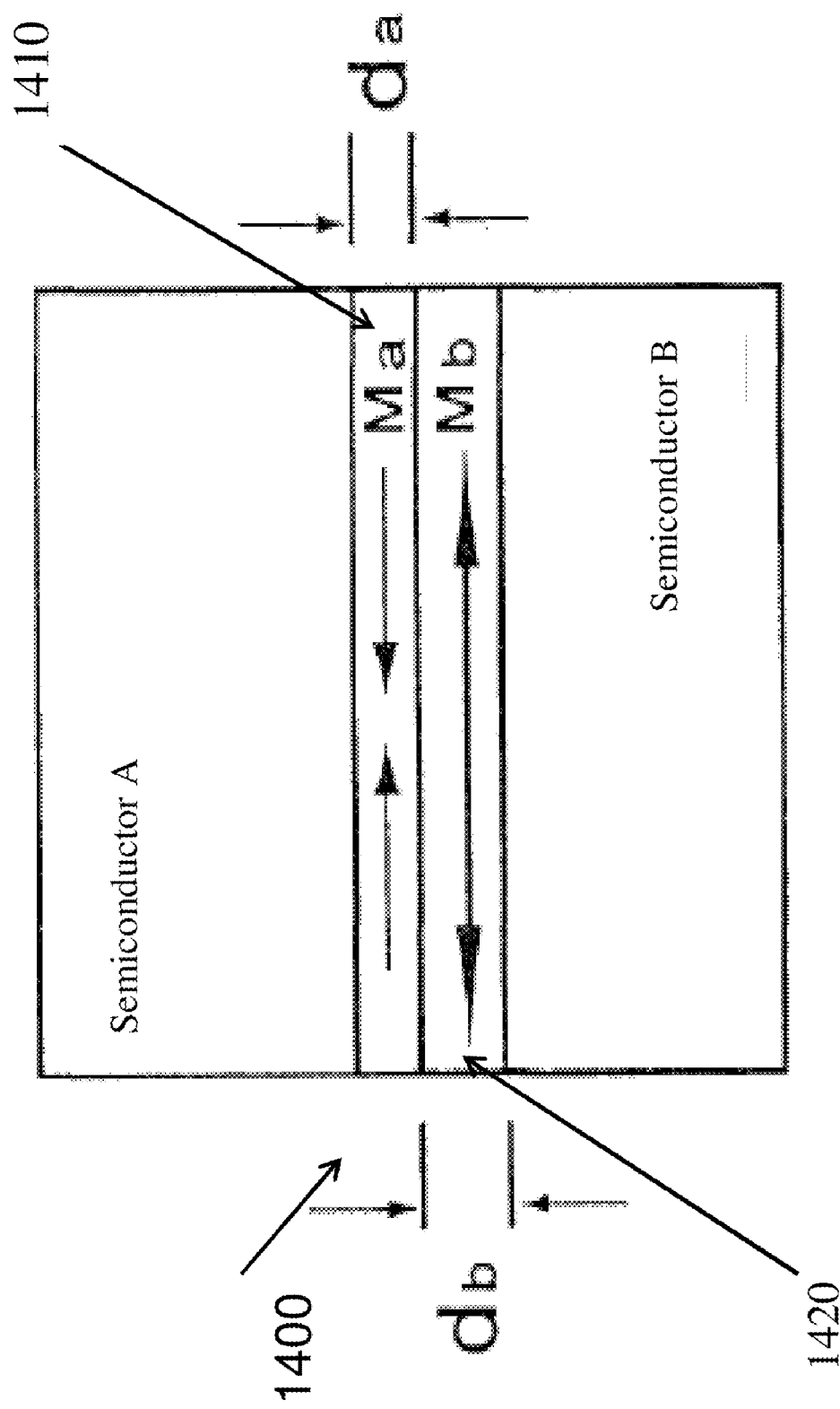
Figure 14B:
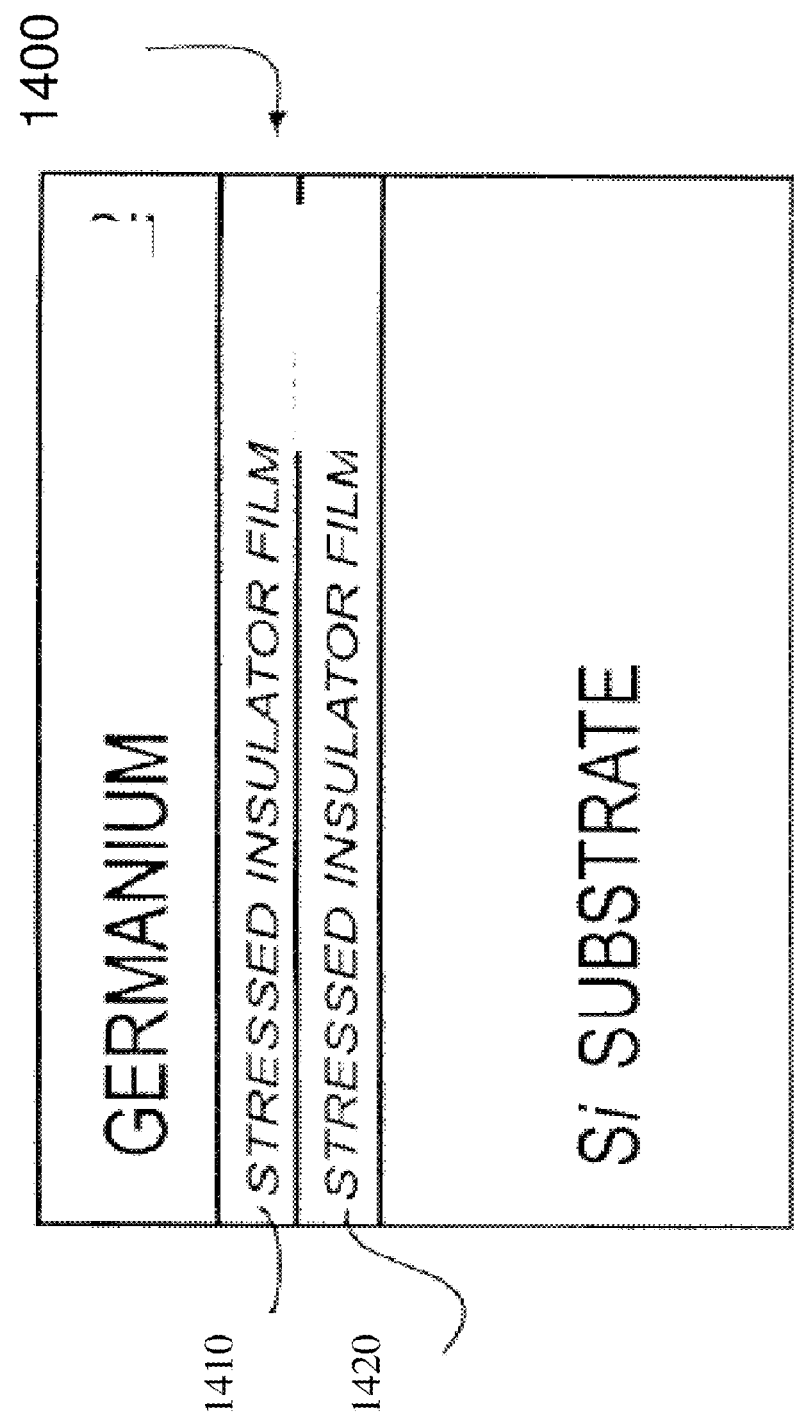

FIG. 14a is a side view of two semiconductor layers with stressed layers between; FIG. 14b is a side view of an embodiment in which stressed rare-earth based layers enable a product comprising silicon and germanium layers.

DETAILED DESCRIPTION OF THE INVENTION

A substrate may be a semiconductor, such as silicon, and be poly or multi-crystalline, silicon dioxide, glass or alumina. As used herein multi-crystalline includes poly, micro and nano crystalline. "A layer" may also comprise multiple layers. For example, one embodiment may comprise a structure such as: substrate/[REO]1/Si(1-x)Ge(x)/[REO]2/Si(1-y)Ge(y)/[REO]3/Si(1-z)Ge(z); wherein [REO]1 is one or more rare earth compounds and one or more layers in a sequence proceeding from a substrate to a first Group IV based compound, Si(1-x)Ge(x), and on to a Group IV based semiconductor top layer; Group III-V and II-VI and combinations thereof are also possible embodiments. Disclosed layers are, optionally, single crystal, multi-crystalline or amorphous layers and compatible with semiconductor processing techniques. As used herein a "REO" layer contains two or more elements, at least one chosen from the Lanthanide series plus Scandium and Yttrium and at least one chosen from oxygen and/or nitrogen and/or phosphorous and/or mixtures thereof; structures are not limited to specific rare-earth elements cited in examples. Rare earth materials are represented as $(RE1+RE2+ \ldots REn)_m O_n$ where the total mole fraction of rare earths, $1 \ldots n$, is one for stoichiometrc compounds and not limited to 1 for non-stoichiometric compounds. In some embodiments, in addition to the RE $(1, 2, \ldots n)$ an alloy may include Si and/or Ge and/or C, carbon; optionally an oxide may be an oxynitride or oxyphosphide; m and n may vary from greater than 0 to 5.

In some embodiments a low cost substrate such as soda glass or polycrystalline alumina is used in combination with a rare-earth based structure comprising a diffusion barrier layer, a buffer layer, an active region, up and/or down layer(s), one or more reflectors, one or more Bragg layers, texturing is optional; one or more layers may comprise a rare-earth. The exact sequence of the layers is application dependent; in some cases for a solar cell, sunlight may enter a transparent substrate initially; in other cases a transparent substrate may be interior of multiple layers.

FIGS. 1a and 1b illustrate prior art embodiments; FIG. 1a shows schematically a III-V triple junction cell on a Ge substrate. FIG. 1b shows schematically a Ge based junction on an insulator bonded to a Si wafer; both approaches are expensive and have limitations. FIG. 2a Shows the lattice constant, a, of a silicon-germanium alloy, $Si_{1-x}Ge_x$ as x varies from 0, all silicon, to 1, all germanium. FIG. 2b shows schematically the relative difference between Si and Ge unit cells; Ge being about 4.2% larger than Si. FIG. 2c shows schematically a REO based engineered structure; an exemplary embodiment, as shown in FIG. 2c, is a structure comprising a silicon substrate, REO based layer(s), a germanium layer and, optionally, one or more layers overlying the Ge layer; optionally, a semiconductor, optionally silicon, substrate may comprise one or more junctions operable as a solar cell or other device(s); optionally, the germanium layer(s) may comprise one or more junctions operable as a solar cell or other device(s); optionally, the REO layer(s) may comprise one or more layers operable as a diffusion barrier layer, a buffer layer and a transition layer. FIG. 9 shows another exemplary embodiment.

Figure 4:
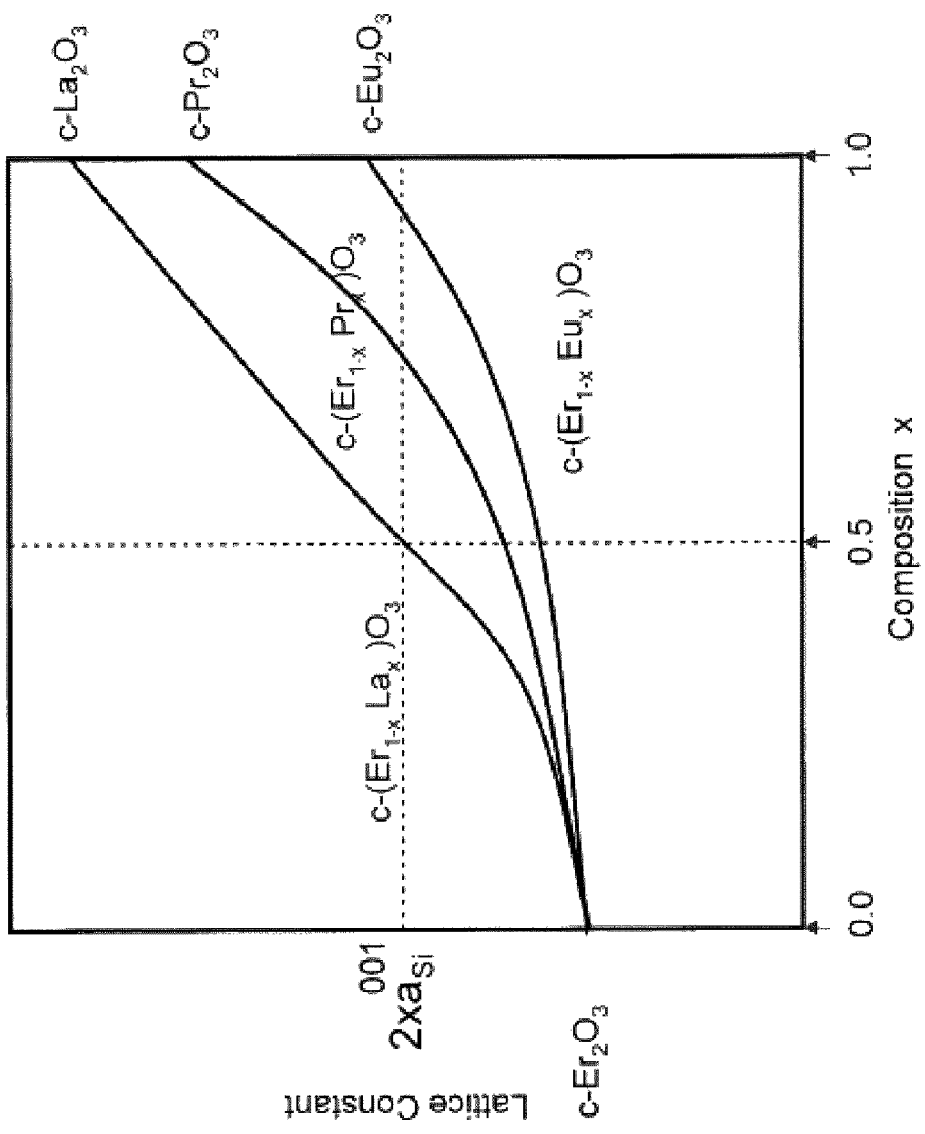

FIG. 3 shows lattice spacing, a, for different rare earths as compared to Si and Ge. FIG. 4 shows how the lattice constant for three erbium based rare earth alloys vary as a function of composition and choice of a second rare earth component versus twice the lattice constant of silicon. $(Er_{1-x}La_x)O_3$, $(Er_{1-x}Pr_x)O_3$, $(Er_{1-x}Eu_x)O_3$ are chosen for this example; other combinations are acceptable also. Exemplary structures include bulk ternary alloys as listed or an alternating, "digital" superlattice of $n(Er_2O_3)/m(Eu_3O_3$, comprising a repeat unit where the average "x-value", $x=m/(n+m)$. Unstable valence rare earths, such as Eu, Pr and La, can be stabilized to a 3+ valence state when alloyed with $(Er_2O_3)$ for $0 \leq x < x_{crit}$, where $x_{crit}$ is where the onset of phase transformation or valence instability re-occurs.

FIG. 5 shows lattice spacing, a, of different SiGe alloys versus lattice spacing for different rare earth alloys as a function of composition. FIG. 6a is an exemplary structure with a ternary rare earth transitioning between a semiconductor layer or substrate and a $Si_{1-x}Ge_x$ layer. FIG. 6b shows the variation in the lattice constant as the rare earth based layer lattice constant transitions from $2a_{Si}$ to $2a_{Si1-xGex}$ based on $a_{RE1y1RE21-y1}$ and $a_{RE1y2RE21-y2}$ of initial rare earth compound $RE1_{y1}RE2_{1-y1}O_3$ and final rare earth compound $RE1_{y2}RE2_{1-y2}O_3$. FIGS. 7a and 7b show alternative embodiments where a rare earth layer may be of somewhat different lattice constant than a silicon or SiGe alloy or germanium layer resulting in compressive or tensile strains in the respective layers. FIG. 8a is an exemplary example for a rare earth based layer of $(Gd_{0.82}Nd_{0.18})_2O_3$ transitioning linearly to $(Gd_{0.35}Nd_{0.65})_2O_3$ between a silicon surface to a layer of $Si_{0.3}Ge_{0.7}$. FIG. 8b is an exemplary example for a rare earth based layer of $(Er_{0.46}La_{0.54})_2O_3$ transitioning in a stepwise or digital fashion to $(Er_{0.24}La_{0.76})_2O_3$ between a $Si_{0.3}Ge_{0.7}$ surface to a layer of $Si_{0.7}Ge_{0.3}$. As disclosed herein a rare earth based transition layer may be a binary, ternary quaternary or higher rare earth compound of composition described by $[RE1]_v[RE2]_w[RE3]_x[J1]_y[J2]_z$ wherein [RE] is chosen from a rare earth; [J1] and [J2] are chosen from a group consisting of Oxygen (O), Nitrogen (N), and Phosphorus (P), and $0 \leq v, w, z \leq 5$, and $0 < x, y \leq 5$.

FIG. 9 is an exemplary embodiment showing a structure 900 starting with a first semiconductor layer 905, optionally, silicon, a first transition layer 910 of composition (RE1, $RE2_{1-x})_2O_3$, a second semiconductor layer 915, a second transition layer 920, a third semiconductor layer 925, a third transition layer 930, and a fourth semiconductor layer 935, optionally, germanium. In general RE1 is different from RE2; however RE3, RE4, RE5, and RE6 need not be different from RE1 and/or RE2. Semiconductor layers 905, 915, 925 and 935 may be one or more Group IV materials; optionally, one or more Group III-V materials; optionally, one or more Group II-VI materials. In some embodiments the semiconductor layers are operable as solar cells tuned to different portions of the solar spectrum. In preferred embodiments transition layers 910, 920, 930 enable stress engineering between the semiconductor layers.

Figure 10B:
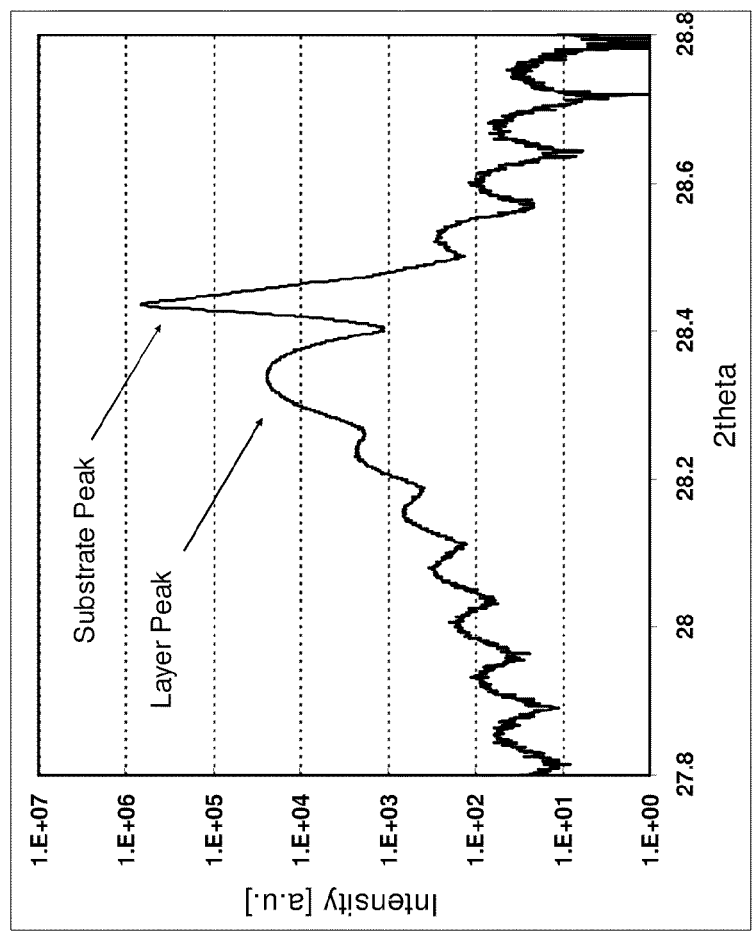

FIG. 10a is an exemplary example of a single composition layer of $(Gd_{0.75}Nd_{0.25})_2O_3$ transitioning between a silicon layer and a $Si_{0.95}Ge_{0.05}$ layer. FIG. 10b shows an x-ray scan of the structure showing the intensity of the substrate and layer peaks indicating the close lattice match.

FIG. 11 shows x-ray diffraction patterns of silicon as unstrained cubic, of a $Si_{0.8}Ge_{0.2}$ in biaxial compression and two Si-rare earth alloys in biaxial tension. These are examples of layer composition combinations for achieving strain symmetry in a superlattice type structure; also referred to as a strain symmetrized superlattice. FIG. 12a is a TEM of an exemplary structure; FIG. 12b is a magnification of the superlattice portion exhibiting strain symmetry. Additional information is found in U.S. Application Ser. No. 11/828,964. FIG. 13 is an x-ray scan of a strain symmetrized superlattice structure.

FIGS. 14a and b show an embodiment of a strain symmetrized structure 1400 with a Semiconductor B, optionally silicon, based lower layer and a Semiconductor A, optionally germanium, based upper layer. Referring additionally to FIGS. 14a and 14b, with individual layers or films 1410 and 1420 forming a composite layer 1400, in accordance with the present invention. Layer 1410 has a width designated $d_a$ and layer 1420 has a width designated $d_b$. Layer 1410 has a bulk modulus Ma and layer 1420 has a bulk modulus Mb. To provide a desired composite stress in the composite layer 1400, the individual thicknesses ($d_a$ and $d_b$) required in each layer 1410 and 1420 can be calculated based on stress energy at the interface. Layer 1410 and 1420 may be separated by a third layer, not shown, to enhance the functionality of composite layer 1400 as a sink for lattice defects and/or functionality as an up and/or down converter of incident radiation. In some embodiments $d_a$ and $d_b$ may be about 2 nm; in some embodiments $d_a$ and $d_b$ may be about 200 nm; alternatively, $d_a$ and $d_b$ may be between about 2 to about 200 nm; a third layer, not shown, may be between about 2 to about 200 nm.

Referring to FIG. 14b, a specific example of a structure including a exemplary germanium semiconductor layer on a composite rare earth layer 1400, in accordance with the present invention, is illustrated. It is known that germanium has a large thermal and lattice mismatch with silicon. However, in many applications it is desirable to provide crystalline germanium active layers on silicon layers. In the present example, stressed layer 1410 of composite insulating layer 1400 is adjacent a germanium layer and stressed layer 1420 is adjacent a silicon layer. Stressed layers 1410 and 1420 are engineered (e.g. in this example highly stressed) to produce a desired composite stress in composite layer 1400. In some embodiments, compositions of stressed insulating layers 1410 and 1420 are chosen to reduce thermal mismatch between first and second semiconductor layers also.

In one embodiment rare earth oxide layers are also performing a task of strain balancing, such that the net strain in the REO/Si(1-y)Ge(y) composite layer is effectively reduced over that of a single REO layer of the same net REO thickness grown on the same substrate, thus allowing a greater total thickness of REO to be incorporated into the structure before the onset of plastic deformation. In another embodiment rare earth oxide layers are strain balanced such that a critical thickness of the REO/Si(1-y)Ge(y) composite is not exceeded. In another embodiment REO/Si(1-y)Ge(y) composite layer acts to mitigate propagation of dislocations from an underlying Si(1-x)Ge(x) layer through to the overlying Si(1-z)Ge(z) layer thereby improving the crystallinity and carrier lifetime in the Si(1-z)Ge(z) layer. In another embodiment, the Si(1-x)Ge(x) has a narrower band gap than the Si(1-z)Ge(z) layer (i.e. x>z) such that the Si(1-z)Ge(z) layer and the Si(1-x)Ge(x) layers form a tandem solar cell. For example, solar radiation impinges upon the Si(1-z)Ge(z) layer first where photons of energy greater than the band gap of Si(1-z)Ge(z) are absorbed and converted to electrical energy. Photons with energy less than the band gap of Si(1-z)Ge(z) are passed through to the Si(1-x)Ge(x) layer where a portion may be absorbed. In one embodiment rare earth oxide layers are performing a task of strain balancing, such that the net strain in the REO/Si(1-y)Ge(y) composite layer is effectively reduced over that of a single REO layer of the same net REO thickness grown on the same substrate.

In some embodiments a device comprises a Group IV semiconductor based superlattice comprising a plurality of layers that form a plurality of repeating units, wherein at least one of the layers in the repeating unit is a layer with at least one species of rare earth ion wherein the repeating units have two layers comprising a first layer comprising a rare earth compound described by $([RE1]_x[RE2]_z)_w[J1]_y[J2]_u$ and a second layer comprising a compound described by $Si_{(1-m)}Ge_m$, wherein x, y>0, m≧0, 0≦u, w, z≦3 and J is chosen from oxygen, nitrogen, phosphorous and combinations thereof.

In some embodiments a device comprises a superlattice that includes a plurality of layers that form a plurality of repeating units, wherein at least one of the layers in the repeating unit is a layer with at least one species of rare earth ion wherein the repeating units comprise two layers wherein the first layer comprises a rare earth compound described by $[RE1]_x[J]_y$ and the second layer comprises a compound described by $((RE2_mRE3_n)_oJ_p$ wherein m, n, o, p, x, y>0 and J is chosen from a group comprising oxygen, nitrogen, phosphorous and combinations thereof; optionally, RE1, RE2 and RE3 may refer to the same or different rare earths in different repeating units.

As known to one knowledgeable in the art, a photovoltaic device may be constructed from a range of semiconductors including ones from Group IV materials, Group III-V materials and Group II-VI; additionally, photovoltaic devices such as a laser, LED and OLED may make advantageous use of the instant invention for transitioning between different semiconductor layers.

It is well known that multiple junction solar cells are capable of reaching higher conversion efficiencies than single junction cells, by extracting electrons at an energy closer to the original photon energy that produced the electron. In this invention we describe the use of single or polycrystalline Si(1-x)Ge(x) alloys in combination with single crystal or polycrystalline silicon such that a two or more junction or 'tandem' cell is realized. The monolithic SiGe/Si structure is enabled through the use of a rare-earth oxide transition layer(s) between the Si and SiGe as shown in FIG. 9. REO layers 910, 920, 930 may be one or a plurality of $[RE1]_a[RE2]_b[RE3]_c[O]_g[P]_h[N]_i$ type layers.

An example of a doping and interconnect scheme is where the rear p-type region of a silicon cell is connected through to the p-type region of the SiGe cell by a metalized via through a REO channel. Alternatively a REO layer 910 may be doped to form a conductive buffer layer between Si and SiGe. Other embodiments are also possible, for example where the p and n doping regions are reversed and a tunnel junction is used to create a two terminal device, rather than a three terminal device, as shown. Also possible is a device where the front metal contact and n-type doping region is placed at the back of the silicon layer, with a similar via contact scheme as is shown for the p-type silicon region. SiGe has a crystal lattice constant different to Si, such that when SiGe is deposited epitaxially directly on Si, the SiGe layer is strained. As the SiGe layer is grown thicker, the strain energy increases up to a point where misfit dislocations are formed in the SiGe film, which negatively impact performance of devices, including solar cell devices. In this invention, a REO buffer or transition layer may serve as a strain relief layer between Si and SiGe, such that misfit dislocations are preferentially created in the REO layer, thus reducing the dislocation density in the SiGe layer. The REO layer may also have compositional grading such that the REO surface in contact with the silicon layer is lattice matched to silicon, while the REO surface in contact with the SiGe layer is lattice matched to SiGe. For example, $(Gd_{0.81}Nd_{0.19})_2O_3$ has a lattice spacing of 10.863 Å, which is about twice the lattice spacing of silicon (10.8619 Å). For Si0.43Ge0.57, the bandgap is 0.884 eV which allows the SiGe layer to absorb solar radiation in the band between 1100 to 1400 nm. Twice the lattice spacing of $Si_{0.43}Ge_{0.57}$ is 11.089 Å which is close to the lattice spacing of $Nd_2O_3$ (11.077 Å). Thus, by grading the composition of the REO layer from $(Gd_{0.81}Nd_{0.19})_2O_3$ to $Nd_2O_3$, the strain and dislocation network may be confined to the REO layer, thereby increasing the carrier lifetime and performance of the SiGe cell over that which would be obtained if the SiGe were grown directly on the Si. The instant invention discloses the use of a rare earth transition layer to function as a sink or getter for lattice defects created by the lattice mismatch between a first semiconductor layer and a rare earth layer transitioning to a second semiconductor layer.

X-ray diffraction measurements were performed by using a Phillips X'pert Pro four circle diffractometer. Incident Cu Kα1 beam was conditioned using a Ge (220) four-bounce monochromator; diffracted beam was passed through a channel cut, two bounce (220) Ge analyzer in order to achieve higher resolution. The Bragg reflection from the Si (111) planes was measured to analyze the lattice parameter of the grown structure. X-ray diffraction spectrum shows intensity modulations around the fundamental reflections of the substrate, indicating a smooth epitaxial layer terminally.

In prior art of the same assignee a rare earth based structure is disclosed comprising a first and second region wherein the first region has a first and second surface and the second region has a first and second surface; and the second region has a composition of the form $[RE1]_v[RE2]_w[RE3]_x[J1]_y[J2]_z$, wherein [RE] is chosen from the disclosed rare earth group; [J1] and [J2] are chosen from a group consisting of oxygen (O), nitrogen (N), and phosphorus (P); wherein $0 \leq v, z \leq 5$; and $0 < w, x, y \leq 5$ such that the second region has a composition different from the first region and wherein the first surface of the second region is in direct contact with the second surface of the first region and the first region is comprised of a composition of the form $[RE1]_a[RE2]_b[RE3]_c[J1]_d[J2]_e$, wherein [RE] is chosen from the disclosed rare earth group; [J1] and [J2] are chosen from a group consisting of oxygen (O), nitrogen (N), and phosphorus (P); wherein $0 \leq b, c, e \leq 5$; and $0 < a, d \leq 5$. The structure as disclosed may be used in conjunction with similar structures additionally comprising a transition metal, TM and, optionally comprising a Group IV element or mixtures thereof.

In some embodiments one or more rare earth layers enable a transition from a semiconductor material of a first type and/or composition and/or orientation to a semiconductor material of a second type, composition and/or orientation; an embodiment is depicted in FIG. 6a. As disclosed herein the rare-earth layers may function as a transition layer(s) between, for example, a silicon layer(s) and a germanium layer(s) such that the rare-earth layer(s) acts as a sink for defects attempting to propagate from an initial layer, optionally a silicon layer, to a final layer, optionally a germanium layer, during a growth or deposition process. A REO layer, operable as a transition layer, enables, for example, a $Si_{(1-m)}Ge_m$ layer to be grown or deposited on a different composition $Si_{(1-n)}Ge_n$ layer to a range thicker than the conventional critical layer thickness hence enabling different device structures; for example, one device may be a tandem solar cell where more efficient absorption of a portion of the spectrum not adsorbed by a first solar junction is enabled.

A growth or deposition process may be any one, or combination, of those known to one knowledgeable in the art; exemplary processes include CVD, MOCVD, PECVD, MBE, ALE, PVD, electron beam evaporation, multiple source PVD. An exemplary structure as shown in FIG. 9 may be a multiple-junction solar cell wherein one region comprises a silicon p-n junction cell, a second region is a rare-earth transition region functioning as a defect sink and a third region is a germanium p-n junction cell; optionally, a first or second region may be Group IV, Group III-V or Group II-VI semiconductors.

In some embodiments a rare-earth layer transition region comprises a first rare-earth portion of first composition adjacent to a first semiconductor region, a second rare-earth portion of second composition adjacent to a second semiconductor region and a third rare-earth portion of third composition separating the first and second rare-earth portion; in some embodiments the third rare earth composition varies from the first rare-earth composition to the second rare-earth composition in a linear fashion; alternatively the third rare earth composition may vary in a step-wise fashion; alternatively, the third rare earth region may comprise multiple layers, each with a distinct composition determined by a desired stress profile to facilitate the capture and/or annihilation of lattice defects as may be generated by the transition from the first and second semiconductor regions during a growth process and subsequent process steps. In some embodiments a third rare earth region may transition from a compressive stress to a tensile stress based upon the beginning and ending compositions.

High resolution transmission electron microscope image of another optional embodiment of rare-earth atom incorporated in silicon and/or silicon-germanium structures is shown in FIG. 94 of U.A. 2008/0295879. The germanium and erbium fractions may be used to tune the strain in the material. The Si/SiEr and Si/SiGeEr layers demonstrate that Ge is effective in reducing dislocation and threading dislocations vertically through the layers along the growth direction.

Atomic and molecular interstitial defects and oxygen vacancies in rare-earth oxide (REOx) can also be advantageously engineered via non-stoichiometric growth conditions. The atomic structure of singly and doubly positively charged oxygen vacancies ($O_v^+$, $O_v^{2+}$), and singly and doubly negatively charged interstitial oxygen atoms ($O_i^-$, $O_i^{2-}$) and molecules ($O_{2i}^-$, $O_{2i}^{2-}$) can be engineered in defective crystals of $REO_{x=1.5 \pm y}$, $0.1 \leq y \leq 1$). Singly and doubly negatively charged oxygen vacancies ($O_v^-$, $O_v^{2-}$) are also possible. Rare-earth metal ion vacancies and substitutional species may also occur and an oxygen vacancy paired with substitutional rare-earth atom may also occur. However, atomic oxygen incorporation is generally energetically favored over molecular incorporation, with charged defect species being more stable than neutral species when electrons are available from the rare-earth conduction band. Alternatively, nitrogen, N, or phosphorus, P, may replace the oxygen or used in various combinations.

Nitrogen-containing defects can be formed during growth of rare-earth-oxide using nitrogen and nitrogen containing precursors (e.g., $N_2$, atomic N, $NH_3$, NO, and $N_2O$). The role of such defects using nitrogen in oxides leads to an effective immobilization of native defects such as oxygen vacancies and interstitial oxygen ions and significantly reduce the fixed charge in the dielectric. Non-stoichiometric REOx films can be engineered to contain oxygen interstitials, (e.g., using oxygen excess and/or activated oxygen $O_2^*$, $O^*$) and/or oxygen vacancies (e.g., using oxygen deficient environment).

The process of vacancy passivation by molecular nitrogen is also possible. Atomic nitrogen is highly reactive and mobile once trapped in the oxide structure resulting in the more effective passivation of oxygen vacancies. The REOx materials generate positive fixed charge via protons and anion vacancies and can be effectively reduced by introduction of atomic nitrogen and/or molecular nitrogen.

Rare earth multilayer structures allow for the formation of multiple semiconductor layers. Enhanced operating performance is achieved compared to structures without rare earths. Alternatively, in some embodiments, a first semiconductor layer may be polycrystalline, large grained crystalline or micro/nano crystalline; subsequent layers may also be polycrystalline, large grained crystalline or micro/nano crystalline. As used herein, large grained is defined as a grain of lateral dimension much larger than the dimension in the growth direction.

In some embodiments a structure within a solid state device comprises a first region of first composition, a second region of second composition and a third region of third composition separated from the first region by the second region; wherein the second region comprises a first and second rare-earth compound such that the lattice spacing of the first compound is different from the lattice spacing of the second compound and the third composition is different from the first composition; optionally, a solid state device comprises a first and third region comprising substantially elements only from Group IV; optionally, a solid state device comprises a third region comprising substantially elements only from Groups III and V; optionally, a solid state device comprises a third region comprising substantially elements only from Groups II and VI; optionally, a solid state device comprises a second region described by $[RE1]_v[RE2]_w[RE3]_x[J1]_y[J2]_z$ wherein [RE] is chosen from a rare earth; [J1] and [J2] are chosen from a group consisting of Oxygen (O), Nitrogen (N), and Phosphorus (P), and $0 \leq v, w, z \leq 5$, and $0 < x, y \leq 5$; optionally, a solid state device comprises a second region comprising a first portion of fourth composition adjacent said first region; a second portion of fifth composition; and a third portion of sixth composition separated from the first portion by the second portion and adjacent said third region wherein the fifth composition is different from the fourth and sixth compositions; optionally, a solid state device comprises a second portion comprising a first surface adjacent said first portion and a second surface adjacent said third portion and said fifth composition varies from the first surface to the second surface; optionally a solid state device comprises a second portion comprising a first surface adjacent said first portion and a second surface adjacent said third portion and comprises a superlattice with a structure comprising two layers of different composition which repeat at least once; optionally a solid state device comprises a first portion in a first state of stress and a third portion in a second state of stress different from the first state of stress.

In some embodiments a solid state device comprises first and second semiconductor layers separated by a rare earth layer wherein the first semiconductor layer is of composition $X_{(1-m)}Y_m$; the second semiconductor layer is of composition $X_{(1-n)}Y_n$ and the rare earth layer is of a composition described by $[RE1]_v[RE2]_w[RE3]_x[J1]_y[J2]_z$ wherein [RE] is chosen from a rare earth; [J1] and [J2] are chosen from a group consisting of oxygen (O), nitrogen (N), and phosphorus (P), and X and Y are chosen from Group IV elements such that $0 \leq n, m \leq 1$, $0 \leq v, z \leq 5$, and $0 < w, x, y \leq 5$ and wherein n is different from m; optionally, a device comprises a rare earth layer comprising a first and second rare earth layer such that the composition of the first layer is different from the composition of the second layer and the lattice spacing of the first layer is different from the lattice spacing of the second layer.

In some embodiments a solid state device comprises a first semiconductor layer; a second semiconductor layer; and a rare earth layer comprising regions of different composition separating the first semiconductor layer from the second semiconductor layer; wherein the rare earth layer is of a composition described by $[RE1]_v[RE2]_w[RE3]_x[J1]_y[J2]_z$ wherein [RE] is chosen from a rare earth; [J1] and [J2] are chosen from a group consisting of oxygen (O), nitrogen (N), and phosphorus (P), such that $0 \leq v, w, z \leq 5$, and $0 < x, y \leq 5$ such that the composition of the rare earth layer adjacent the first semiconductor layer is different from the composition of the rare earth layer adjacent the second semiconductor layer; optionally, a device comprises first and second semiconductor materials chosen from one or more Group IV elements or alloys of Group III-V elements or alloys of Group II-VI elements; optionally, a device comprises a rare earth layer comprising a superlattice of a structure that repeats at least once; optionally, a device comprises a rare earth layer comprising a first region adjacent said first semiconductor layer, a second region adjacent said second semiconductor layer and a third region separating the first region from the second region such that the composition of the third region is different from the first region and the second region.

The foregoing described embodiments of the invention are provided as illustrations and descriptions. They are not intended to limit the invention to a precise form as described. In particular, it is contemplated that functional implementation of invention described herein may be implemented equivalently in various combinations or other functional components or building blocks. Other variations and embodiments are possible in light of above teachings to one knowledgeable in the art of semiconductors, thin film deposition techniques, and materials; it is thus intended that the scope of invention not be limited by this Detailed Description, but rather by Claims following. All patents, patent applications, and other documents referenced herein are incorporated by reference in their entirety for all purposes, unless otherwise indicated.

We claim:

1. A structure within a solid state device comprising at least two photovoltaic cells in tandem; the structure comprising;
    a first solar cell of first composition comprising first and second surfaces;
    a second region of second composition comprising first and second surfaces; and
    a second solar cell of third composition comprising first and second surfaces separated from the first region by the second region; the first solar cell and second solar cell being arranged in tandem;

wherein the second region consists substantially of first and second rare-earth oxide compounds such that the lattice spacing of the first rare-earth oxide compound is different from the lattice spacing of the second rare-earth oxide compound and wherein the first and second solar cells consist substantially of elements only from Group IV and the third composition is different from the first composition and the first surface of the second region is in contact with substantially all of the second surface of the first solar region and the second surface of the second region is in contact with substantially all of the first surface of the second solar cell and wherein the composition of the second region consists substantially of $[RE1]_v[RE2]_w[RE3]_x[J1]_y[J2]_z$ wherein [RE] is chosen from a rare earth; [J1] is oxygen and [J2] is chosen from a group consisting of Oxygen (O), Nitrogen (N), and Phosphorus (P), and $0 \leq v, z \leq 5$, and $0 \leq w, x, y \leq 5$.

2. A solid state device of claim 1 wherein said second region comprises, a first portion of fourth composition adjacent said first solar cell;

a second portion of fifth composition; and a third portion of sixth composition separated from the first portion by the second portion and adjacent said second solar cell wherein the fifth composition is different from the fourth and sixth compositions.

3. A solid state device of claim 2 wherein said second portion comprises a first surface adjacent said first portion and a second surface adjacent said third portion and said fifth composition varies from the first surface to the second surface.

4. A solid state device of claim 2 wherein said second portion comprises a first surface adjacent said first portion and a second surface adjacent said third portion and comprises a superlattice with a structure comprising two layers of different composition which repeat at least once.

5. A solid state device of claim 2 wherein said first portion is in a first state of stress and said third portion is in a second state of stress different than the first state of stress.

6. A solid state device comprising at least two solar cells in tandem; the device comprising:

first and second semiconductor layers operable as solar cells in tandem separated by a rare earth layer wherein the first semiconductor layer consists of composition $X_{(1-m)}Y_m$; the second semiconductor layer consists of composition $X_{(1-n)}Y_n$ and the rare earth layer is of a composition consisting substantially of $[RE1]_v[RE2]_w[RE3]_x[J1]_y[J2]_z$ wherein [RE] is chosen from a rare earth; [J1] is oxygen (O), nitrogen (N), and phosphorus (P), and X and Y are chosen from Group IV elements such that $0 \leq n, m \leq 1, 0 \leq v, z \leq 5$, and $0 \leq w, x, y \leq 5$; and wherein n is different from m.

7. The device of claim 6 wherein said rare earth layer comprises a first and second rare earth layer such that the composition of the first layer is different from the composition of the second layer and the lattice spacing of the first layer is different from the lattice spacing of the second layer.

8. A solid state device comprising at least two solar cells in tandem; the device comprising;

first semiconductor layer operable as a solar cell;

second semiconductor layer operable as a solar cell; the first semiconductor layer and second semiconductor layer being arranged in tandem; and a rare earth layer comprising regions of different composition separating the first semiconductor layer from the second semiconductor layer; wherein the rare earth layer is of a composition consisting substantially of $[RE1]_v[RE2]_w[RE3]_x[J1]_y[J2]_z$ wherein [RE] is chosen from a rare earth; [J1] is oxygen and [J2] is chosen from a group consisting of oxygen (O), nitrogen (N), and phosphorus (P), such that $0 \leq v, z \leq 5$, and $0 \leq w, x, y \leq 5$ such that the composition of the rare earth layer adjacent the first semiconductor layer is different from the composition of the rare earth layer adjacent the second semiconductor layer.

9. The device of claim 8 wherein the first and second semiconductor materials are chosen from one or more Group IV elements or alloys.

10. The device of claim 8 wherein the rare earth layer comprises a superlattice of a structure that repeats at least once.

11. The device of claim 8 wherein said rare earth layer comprises;

a first region adjacent said first semiconductor layer;

a second region adjacent said second semiconductor layer; and a third region separating the first region from the second region such that the composition of the third region is different from the first region and the second region.

* * * * *